United States Patent
Rossi et al.

(10) Patent No.: US 9,020,450 B2
(45) Date of Patent: Apr. 28, 2015

(54) OUTPUT STAGE FOR WIRELESS TRANSMITTER

(71) Applicant: Marvell World Trade Ltd, St. Michael (BB)

(72) Inventors: Paolo Rossi, Pavia (IT); Enrico Sacchi, Pavia (IT); Rinaldo Castello, Arcore (IT)

(73) Assignee: Marvell World Trade Ltd. (BB)

( * ) Notice: Subject to any disclaimer, the term of this patent is extended or adjusted under 35 U.S.C. 154(b) by 43 days.

(21) Appl. No.: 13/717,762

(22) Filed: Dec. 18, 2012

(65) Prior Publication Data

US 2013/0165055 A1    Jun. 27, 2013

Related U.S. Application Data

(60) Provisional application No. 61/578,618, filed on Dec. 21, 2011.

(51) Int. Cl.
- *H04B 1/02* (2006.01)
- *H04B 1/40* (2006.01)
- *H03F 3/24* (2006.01)
- *H03F 3/45* (2006.01)

(52) U.S. Cl.
CPC .................. *H04B 1/40* (2013.01); *H03F 3/245* (2013.01); *H03F 3/45179* (2013.01)

(58) Field of Classification Search
CPC .............. H04B 1/02; H04B 1/04; H04B 1/40; H03F 3/245; H03F 3/45179
USPC .......... 455/91, 127.1, 127.4, 103, 209, 252.1, 455/293
See application file for complete search history.

(56) References Cited

U.S. PATENT DOCUMENTS

2005/0191974 A1*  9/2005  Pan ............................... 455/109
2007/0139110 A1   6/2007  Prouet et al.

OTHER PUBLICATIONS

Patent Cooperation Treaty (PCT) International Search Report and Written Opinion in co-pending PCT International Application No. PCT/IB2012/002895 (International Filing Date Dec. 18, 2012) having a Date of Mailing of Aug. 12, 2013 (13 pgs).

* cited by examiner

Primary Examiner — Tuan Pham (57) ABSTRACT

In one embodiment, an apparatus includes a first block configured to decompose an input signal into a positive component and a negative component. The apparatus further includes a second block configured to generate a mixer positive driver component from the positive component and a mixer negative driver component from the negative component and input the mixer positive driver component and the negative driver component into a mixer for a wireless transmitter.

15 Claims, 8 Drawing Sheets

OUTPUT STAGE FOR WIRELESS TRANSMITTER

CROSS REFERENCE TO RELATED APPLICATIONS

The present disclosure claims priority to U.S. Provisional App. No. 61/578,618 for "Class AB Output Stage for Class AB Transconductor Driving" filed Dec. 21, 2011, the contents of which are incorporated herein by reference in their entirety.

BACKGROUND

Unless otherwise indicated herein, the approaches described in this section are not prior art to the claims in this application and are not admitted to be prior art by inclusion in this section.

Figure 1:
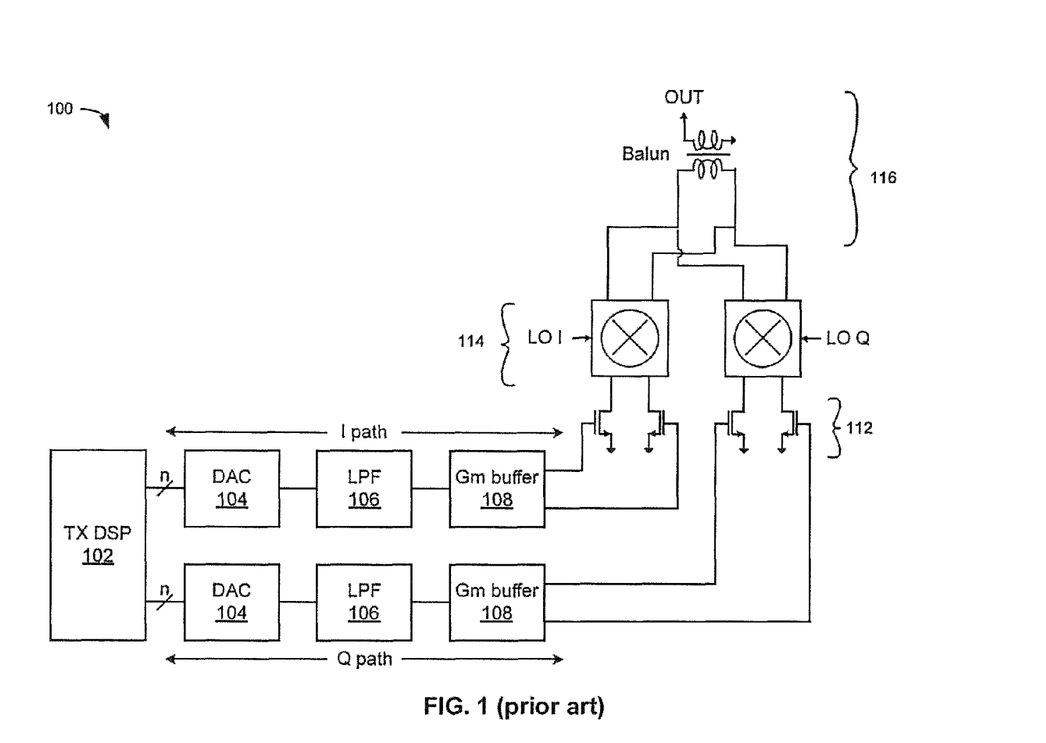
FIG. 1 depicts an example of a transmitter according to one embodiment.

FIG. 1 depicts an example of a transmitter 100 for wireless communications. The analog section is highlighted. Modern wireless standards are based on digital modulations in complex domain therefore the desired signal is achieved by the quadrature combination of in phase (I) and quadrature (Q) signals. A transmitter digital signal processor (DSP) 102 outputs are fed into the analog upconversion chain through digital-to-analog converters (DACs) 104. Analog low pass filters LPF 106 (often called reconstruct filters) cancel out the unwanted DAC signal replicas. Gm buffers 108 act as driver for the mixer transconductor.

Gm buffers 108 receive I and Q signals from low pass filters (LPFs) 106 and drive the upconverter transconductor stage. Upconverters are based on the classical Gilbert cell therefore they include a base-band current input stage (transconductor) 112, a mixing stage (often called quad) 114 and the RF output section 116. Mixing stage 114 multiplies the incoming baseband current by a local oscillator signal. A synthesizer generates a local oscillator (LO) signal. Frequency divider/LO generator then generates the I version for the LO signal (LO I) and Q version for the LO signal (LO Q). The LO I and LO Q signals may be differential. Mixers use the LO I signal and the LO Q signal to upconvert the baseband I and Q signals to differential radio frequency (RF) signals.

Mixer RF output stage may have a resonant load. In this example, a resonant transformer—balun (BALanced-UNbalanced) 116—converts the incoming differential RF signal into a single ended signal. The output signal is sent to a power amplifier that is off an integrated circuit (IC). Additionally, balun 116 may be off chip or in the package of the preamplifier (PA). More in general transmit path may be multimode/multiband and can transmit signals over multiple wireless bands. Wireless bands may correspond to different wireless standards or different operative bands defined for the same standard. In such environment, several baluns 116 could be provided for different wireless bands, such as a second generation (2G) high band (HB), a 2G low band (LB), a third/fourth generation (3G or 4G) low band and high bands. Similarly in a multi standard wireless equipment outputs could be WLAN 2.4G or 5G, Bluetooth, etc. A balun 116 is selected based on which wireless band is used. Accordingly, transmitter 100 offers a direct up and out approach that does not include a PA buffer. That is, balun 116 directly outputs the RF signal off the chip without going through a PA buffer. Thus, no additional noise and distortion is added from the PA buffer.

The same architecture for transmitter 100 can be used to drive multiple wireless bands. For example, some bands may require differential outputs and some may require single-ended outputs (balanced or unbalanced outputs). In one embodiment, a single-ended output may be converted to multiple differential outputs with a package change. That is, the single-ended output may be converted by changing a ground from a terminal of balun to output a second signal. This outputs differential signals from the two terminals of balun 116. Thus, the same architecture can be configured to drive balanced or unbalanced outputs.

Figure 2:
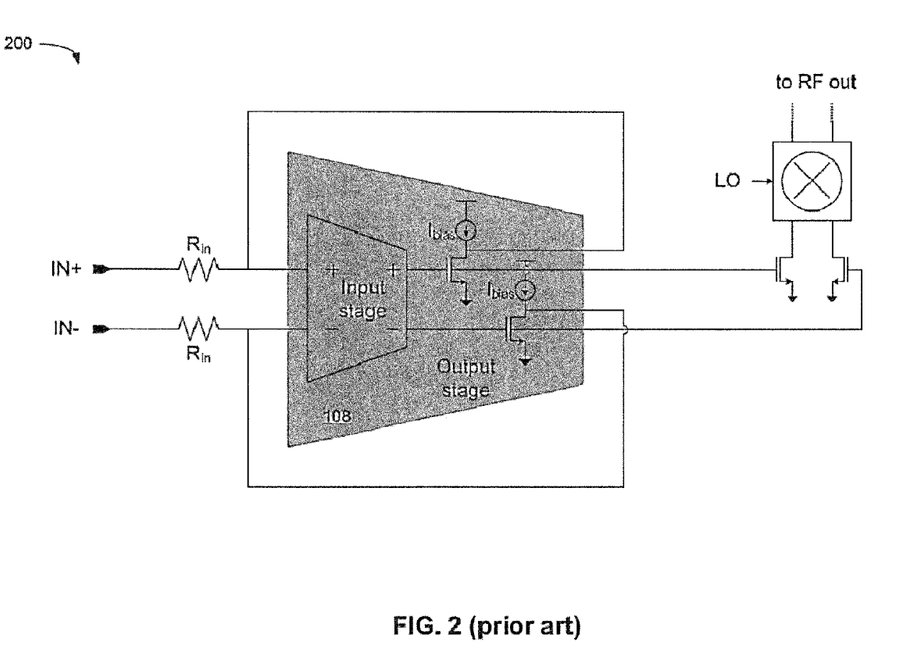
FIG. 2 depicts an example of a Class A output stage for the transmitter.

FIG. 2 depicts an example of a Gm stage for transconductor mixer driving. Nodes IN+ and IN− are connected the low pass filter (LPF) differential outputs. The input resistances Rin convert the LPF output voltage signal into current. The Gm stage close configuration guarantees low distortion in the voltage-to-current conversion. Gm buffer 108 is here schematically depicted as a dual stage amplifier; however, more than two stages could be used for large signal bandwidth or high dynamic range performance. A first stage (input stage) guarantees gain and low noise performance while the second stage (output stage) is used for reference current generation. In order to achieve a correct mixer transconductor driving the Gm output stage is a replica or scaled replica (if current gain is required) of the mixer base-band input stage. From a behavioral point of view, the Gm stage acts as a current mirror reference (closed in a feedback loop) for the mixer transconductor.

A conventional approach is a class A Gm output stage as depicted in the FIG. 2. In order to cover the input stage dynamic range, the output stage bias current (Ibias) should be larger than the peak of the incoming input signal. Modern communication standards are moving towards high data rate modulation scheme. The resulting transmission signals present a very high ratio between root mean square and instant peaks (called peak-to-average-ratio or PAR). For class A blocks, high PAR signal handling is very inefficient (bias current should be sized based on signal peaks) resulting in power waste.

SUMMARY

In one embodiment, an apparatus includes a first block configured to decompose an input signal into a positive component and a negative component. The apparatus further includes a second block configured to generate a mixer positive driver component from the positive component and a mixer negative driver component from the negative component and input the mixer positive driver component and the negative driver component into a mixer for a wireless transmitter.

In one embodiment, a method includes: receiving an input signal; decomposing the input signal into a positive component and a negative component; and generating a mixer positive driver component from the positive component and a mixer negative driver component from the negative component; inputting the mixer positive driver component and the negative driver component into a mixer for a wireless transmitter.

In one embodiment, an apparatus includes: a first output branch including a first transistor of the first type and a second transistor of the second type; a second output branch including a third transistor of the first type and a fourth transistor of the second type, wherein a first current passes through the first transistor and the third transistor and a second current passes through the second transistor and the fourth transistor, and wherein the first output branch and the second output branch output a differential signal to a mixer for a wireless transmitter, the differential signal being a difference of the first current and the second current; a first driver transistor of the first type and a second driver transistor of the first type; and a cross coupled pair of driver transistors of the second type, the cross coupled pair of driver transistors including a third driver transistor and a fourth driver transistor, wherein the first current passes through the first driver transistor and the third driver transistor and the second current passes through the second driver transistor and the third driver transistor.

The following detailed description and accompanying drawings provide a better understanding of the nature and advantages of the present invention.

DETAILED DESCRIPTION

Described herein are techniques for a wireless transmitter. In the following description, for purposes of explanation, numerous examples and specific details are set forth in order to provide a thorough understanding of embodiments of the present invention. Particular embodiments as defined by the claims may include some or all of the features in these examples alone or in combination with other features described below, and may further include modifications and equivalents of the features and concepts described herein.

Figure 3A:
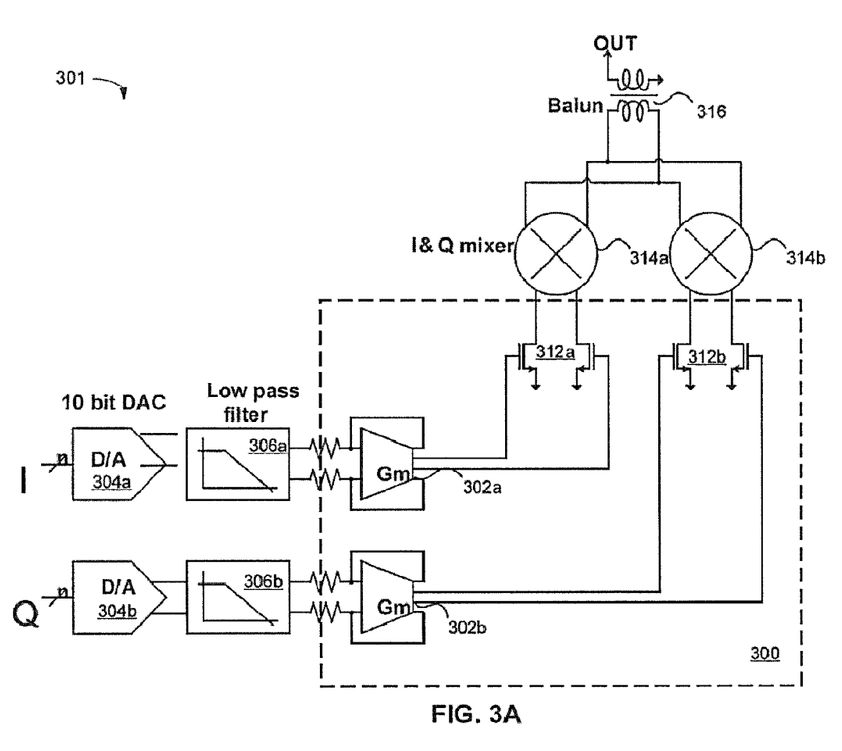
FIG. 3A shows an example of a transmitter according to one embodiment.

FIG. 3A shows an example of a transmitter 301 according to one embodiment. Differential in phase (I) and quadrature (Q) signals may be processed through separate channels. The I and Q channels will be described together but follow the paths as shown in FIG. 3A. Digital-to-analog converters (DACs) 304a/304b convert the digital I and Q signals to analog. The analog I and Q signals are then input into low pass filters (LPFs) 306a/306b. A balun 316 is shown; however, multiple baluns may be provided for different wireless bands, such as a second generation (2G) high band (HB), a 2G low band (LB), a third generation (1G) HB, a 1G HB/LB, and a 1G LB.

An output stage 300 is included to mirror the currents input into output stage 300 from low-pass filters 306a/306b to mixers 314a/314b. Output stage 300 includes a Gm buffer 302 and Gm transistor pairs 312a/312b.

Figure 3B:
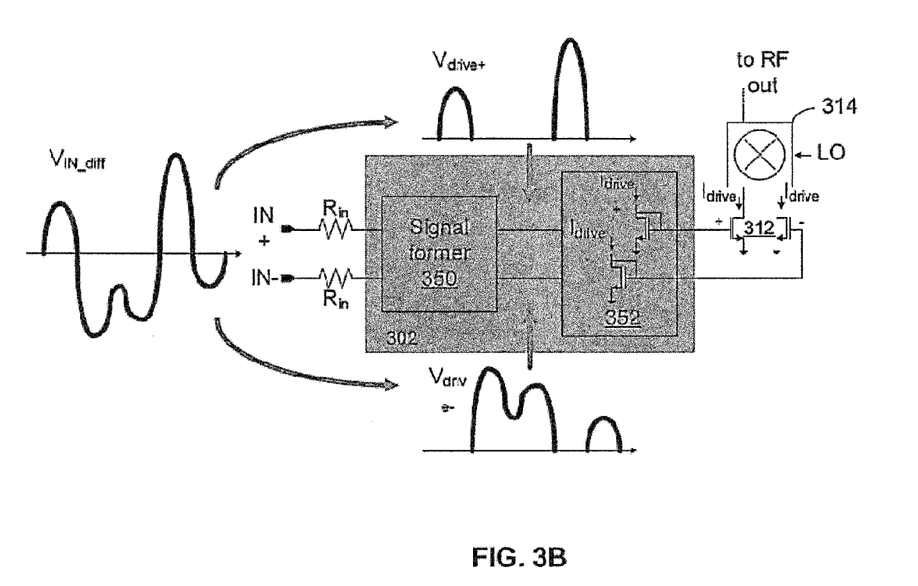
FIG. 3B depicts an example of a Gm stage according to one embodiment.

FIG. 3B depicts an example of a Gm stage 302 according to one embodiment. A first block 350 (signal former) processes the input signal (VIN_diff) by decomposing the input signal into its positive (Vdrive+) and negative (Vdrive−) components. Then the resulting signals are used to generate the mixer driving currents (Idrive+ and Idrive−). In one embodiment, the mixer driving may be achieved as a standard current mirror or improved mirror versions. This signal processing nulls the required quiescent current consumption for both a driving stage 352 (the reference current diode in the FIG. 3B) and the mixer input stage 312.

Figure 4:
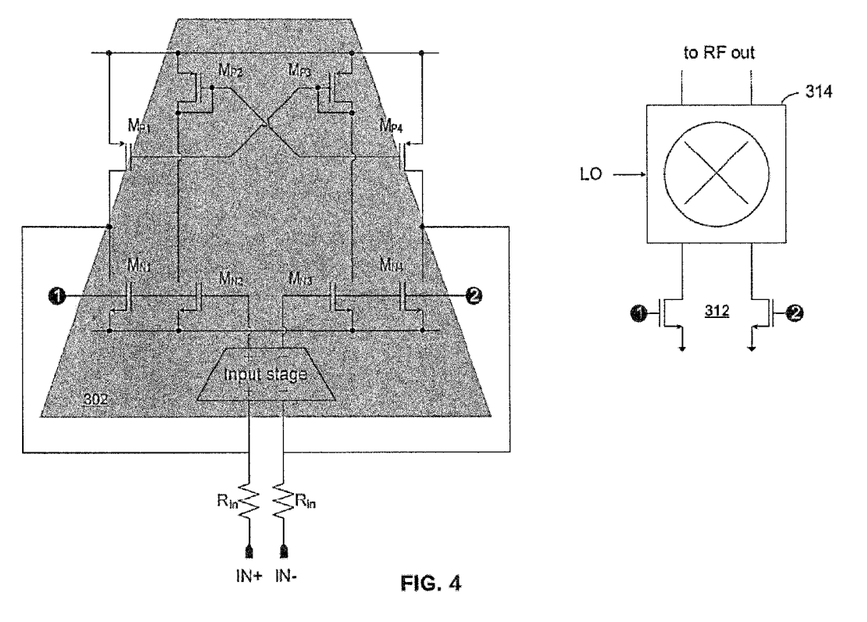
FIG. 4 depicts a more detailed example of the Gm stage according to one embodiment.

FIG. 4 depicts a more detailed example of a Gm stage 302 according to one embodiment. The input signal nodes IN+ and IN− are connected the LPF differential outputs and series resistances Rin convert the voltage signal into current. The block close loop configuration guarantees low distortion in the voltage to current conversion.

Gm stage 302 is a dual stage amplifier according to one embodiment. Although two stages are shown, more than two stages could be employed for large signal bandwidth or high dynamic range performance. A first stage (input stage) guarantees gain and low noise performance while a second stage (signal forming and output stage) has a twofold tasks: at first it decomposes the incoming signal into its positive and negative components and then it drives the mixer input stage 312. The mixer driving nodes are reported as numbered dots 1 and 2.

In order to achieve a correct mixer 314 transconductor driving, the output stage devices (MN1-MN2-MN3-MN4) are replicas or scaled replicas (if current gain is required) of the mixer base-band input stage. From a behavioral point of view, the block acts as a signal former 350 (that decomposes the input signal current) and as a current mirror reference closed in a feedback loop for the mixer transconductor.

The input stage may be a gain stage. In order to describe the output stage behavior, all PMOS devices are equal in size (width and length) and also NMOS devices may be equally sized. However, this assumption does not need to be true as arbitrary device ratios could be defined in order to optimize interstage current consumption. Regarding the mixer interface, NMOS devices are equal or scaled compared to mixer input devices, respectively, if no current gain or a certain amount of current gain is required.

Figure 5:
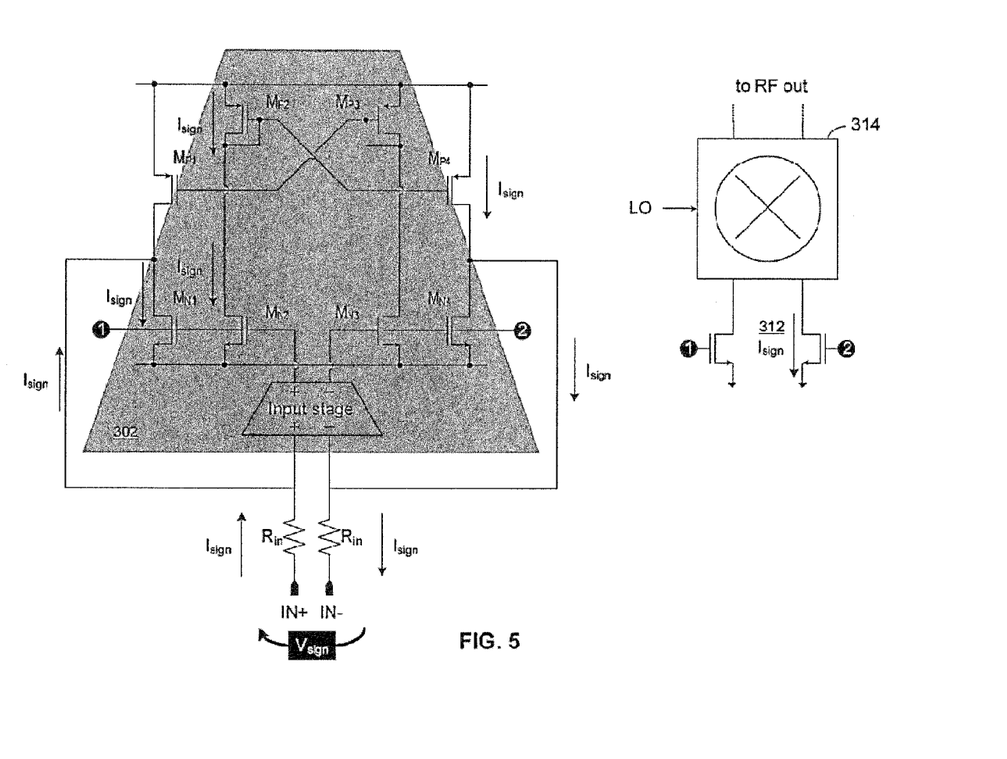
FIGS. 5 and 6 describe the circuit behavior when a positive or negative signal is applied, respectively.
Figure 6:
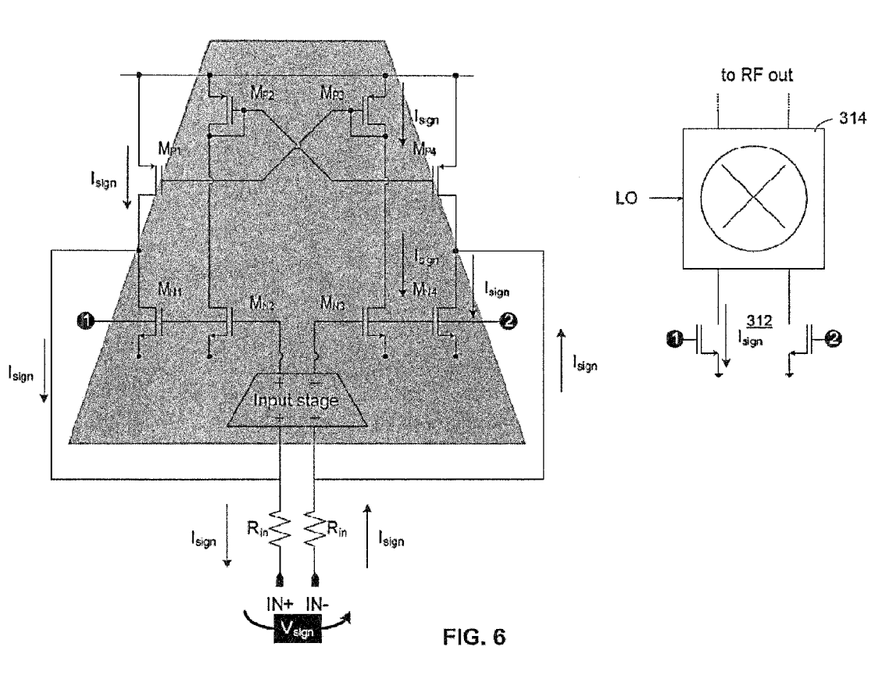

In a quiescent condition, no input signal is fed into the input stage. In principle, the output stage could have minimum bias current, only required to maintain the common loops active. Signal former 352 could decompose the incoming signal into its positive and negative components. FIGS. 5 and 6 describe the circuit behavior when a positive or negative signal is applied, respectively. FIG. 5 shows a positive input signal Vsign. The input resistances Rin translate the voltage signal into the current signal Isign. In order to absorb the incoming signal, a differential loop acts on a gate of transistor MN1, resulting in a drain current of transistor MN1 that is equal to current signal Isign. Transistors MN1 and MN2 share the same gate control so their currents should be equal. The current of transistor MN2 is mirrored to transistor MP4 via transistor MP2. The drain current of transistor MP4 is the same as transistor MN1, and therefore transistor MP4 sources Isign. The mixer transconductance currents are a replica of transistors MN1 and MN2 and transistors MN3 and MN4. As a consequence, the differential input current of the upconverter is a perfect replica of the signal current. A scale ratio between transistors MN1-2-3-4 and the mixer input stage can be used in order to add current gain.

FIG. 6 shows a dual condition of a negative signal at the filter output. In this case transistors MN1-2 and transistors MP3-4 current are not present while transistors MN3-4 and transistors MP1-3 close the signal current loop.

Figure 7:
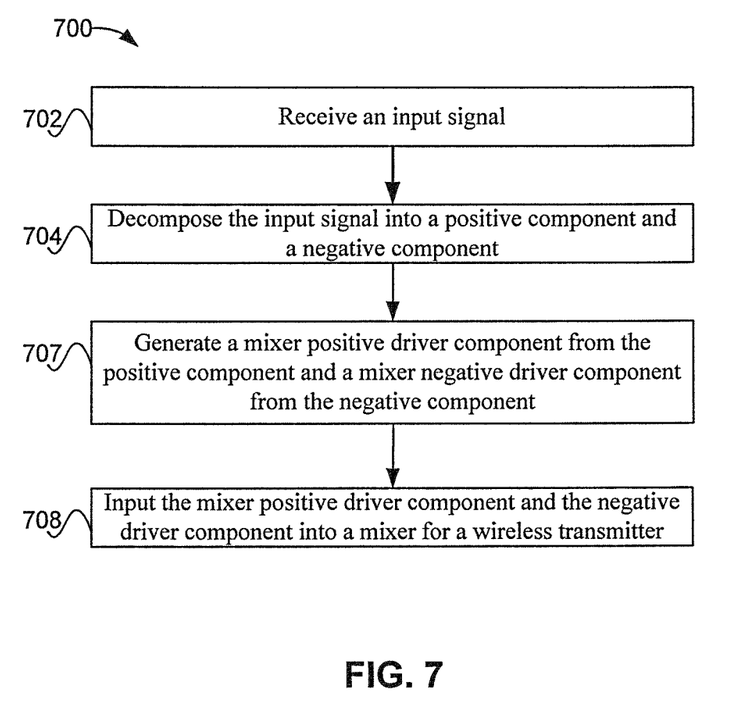
FIG. 7 depicts a simplified flowchart of a method for mirroring a current according to one embodiment.

FIG. 7 depicts a simplified flowchart 700 of a method for mirroring a current according to one embodiment. At 702, the method receives an input signal. At 704, the input signal is decomposed into a positive component and a negative component. At 706, a mixer positive driver component from the positive component and a mixer negative driver component from the negative component are generated. At 708, the method inputs the mixer positive driver component and the negative driver component into a mixer for a wireless transmitter.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The above description illustrates various embodiments of the present invention along with examples of how aspects of the present invention may be implemented. The above examples and embodiments should not be deemed to be the only embodiments, and are presented to illustrate the flexibility and advantages of the present invention as defined by the following claims. Based on the above disclosure and the following claims, other arrangements, embodiments, implementations and equivalents may be employed without departing from the scope of the invention as defined by the claims.

What is claimed is:

1. An apparatus comprising:
a first block configured to decompose an input signal, representing one of an in-phase signal or a quadrature signal, into a positive component and a negative component; and
a second block configured to generate a mixer positive driver component from the positive component and a mixer negative driver component from the negative component and input the mixer positive driver component and the mixer negative driver component into a mixer of a wireless transmitter.

2. The apparatus of claim 1, further comprising a buffer including an input to receive the input signal.

3. The apparatus of claim 2, wherein the buffer includes a first input to receive a positive current in the input signal and a second input to receive a negative current in the input signal.

4. The apparatus of claim 1, wherein the first block and the second block include transistors of a first type and a second type.

5. The apparatus of claim 4, wherein the second block comprises:
a first output branch including a first transistor of the first type and a second transistor of the second type; and
a second output branch including a third transistor of the first type and a fourth transistor of the second type,
wherein a first current passes through the first transistor and the third transistor and a second current passes through the second transistor and the fourth transistor.

6. The apparatus of claim 5, wherein:
the first output branch is coupled to a first input of the mixer, and
the second output branch is coupled to a second input of the mixer.

7. The apparatus of claim 5, wherein:
a gate of the first transistor is coupled to a gate of a fifth transistor,
a gate of the third transistor is coupled to a gate of a sixth transistor, and
the fifth transistor and the sixth transistor are coupled to the mixer.

8. The apparatus of claim 5, wherein the first block comprises:
a first driver transistor of the first type and a second driver transistor of the first type; and
a cross coupled pair of driver transistors of the second type, the cross coupled pair of driver transistors including a third driver transistor and a fourth driver transistor,
wherein the first current passes through the first driver transistor and the third driver transistor and the second current passes through the second driver transistor and the third driver transistor.

9. The apparatus of claim 8, wherein:
a gate of the third driver transistor is coupled to a gate of the second transistor, and
a gate of the fourth driver transistor is coupled to a gate of the third transistor.

10. The apparatus of claim 1, wherein the mixer positive driver component and the mixer negative driver component output to the mixer comprises a difference of a first current and a second current.

11. The apparatus of claim 1, further comprising:
a plurality of baluns wherein one of the baluns is configured to be selected to transmit a wireless signal based on the mixer positive driver component and the mixer negative driver component.

12. A method comprising:
receiving an input signal, representing one of an in-phase signal or a quadrature signal;
decomposing the input signal into a positive component and a negative component;
generating a mixer positive driver component from the positive component and a mixer negative driver component from the negative component; and
inputting the mixer positive driver component and the mixer negative driver component into a mixer of a wireless transmitter.

13. The method of claim 12, wherein receiving the input signal comprises receiving a positive current in the input signal and receiving a negative current in the input signal.

14. The method of claim 12, further comprising transmitting a wireless signal based on the mixer positive driver component and the mixer negative driver component.

15. An apparatus comprising:
a first block configured to decompose an input signal into a positive component and a negative component; and
a second block configured to generate a mixer positive driver component from the positive component and a mixer negative driver component from the negative component and input the mixer positive driver component and the mixer negative driver component into a mixer of a wireless transmitter,
wherein the second block has a first output branch including a first transistor of a first type and a second transistor of a second type, where a gate of the first transistor is coupled to a gate of a fifth transistor,
and wherein the second block has a second output branch including a third transistor of the first type and a fourth transistor of the second type, where a gate of the third transistor is coupled to a gate of a sixth transistor, and where the fifth transistor and the sixth transistor are coupled to the mixer.

* * * * *